United States Patent
Murayama et al.

(10) Patent No.: US 6,396,354 B1
(45) Date of Patent: May 28, 2002

(54) PLL DETECTION CIRCUIT WITH LOCK JUDGEMENT CIRCUIT

(75) Inventors: Norihiro Murayama, Chiba; Kosuke Fujita, Kanagawa, both of (JP)

(73) Assignee: Sony Corporation, Tokyo (JP)

(*) Notice: Subject to any disclaimer, the term of this patent is extended or adjusted under 35 U.S.C. 154(b) by 0 days.

(21) Appl. No.: 09/621,842

(22) Filed: Jul. 24, 2000

(30) Foreign Application Priority Data

Jul. 22, 1999 (JP) .......................................... 11-207427

(51) Int. Cl.$^7$ ........................ H03L 7/095; H04N 5/50; H04N 5/52

(52) U.S. Cl. .................. 331/17; 331/DIG. 2; 331/25; 348/536; 348/731; 348/735; 455/234.1; 455/182.3

(58) Field of Search ...................... 331/17, 25, DIG. 2; 348/536, 731, 735; 455/182.3, 234.1

(56) References Cited

U.S. PATENT DOCUMENTS

| 4,031,549 A | * | 6/1977 | Rast et al. ............. 331/DIG. 2 |
| 4,264,977 A | * | 4/1981 | Deiss ....................... 455/182.3 |
| 4,575,761 A | * | 3/1986 | Carlson et al. ............. 348/731 |

* cited by examiner

*Primary Examiner*—Siegried H. Grimm
(74) *Attorney, Agent, or Firm*—Jay H. Maioli

(57) ABSTRACT

Phase locked loop (PLL) detection circuit that can improve the stability of operation, avoid occurrence of an erroneous operation, and perform PLL lock judgment correctly. Whether a PLL circuit that consists of a phase comparator, a low-pass filter, and a VCO is in a lock state is judged based on a phase error signal in the PLL circuit. The level of the phase error signal is compared with two threshold values, VRL and VRH. When the phase error signal is somewhere between VRL and VRH, a judgment is made that the PLL circuit is in a lock state. A judgment that the PLL circuit is out of a lock state is made in the other cases. This makes it possible to output a correct and stable PLL lock judgment signal.

12 Claims, 9 Drawing Sheets

PLL DETECTION CIRCUIT WITH LOCK JUDGEMENT CIRCUIT

BACKGROUND OF THE INVENTION

1. Field of the Invention

The present invention relates to PLL detection circuits such as those used in radios, television receivers, satellite broadcast receivers, video recorders, receivers of mobile communication systems, and like apparatuses.

2. Description of the Related Art

In synchronous detection receivers such as television receivers, an oscillation signal that is synchronized with a video intermediate frequency (hereinafter abbreviated as VIF) signal obtained by, for example, a tuner or a frequency conversion circuit is generated by using a PLL circuit. The VIF signal is synchronously detected by using the generated oscillation signal and a video detection signal is thereby output. FIG. 11 is a block diagram showing the main part of a detection circuit using a PLL detection circuit of a television receiver.

As shown in the figure, this detection circuit is composed of a PLL circuit that consists of a phase comparator 10, a low-pass filter 20, and a voltage-controlled oscillator (VCO) 30, an AGC (automatic gain control) amplifier (AGC AMP) 50, an AGC control circuit 60, an amplitude detector (AM detector) 70, a comparator 80, an AGC loop filter 90, a low-pass filter 110, and a PLL lock judgment circuit 120.

An input signal $S_{IN}$ that is input to the AGC amplifier 50 is an intermediate frequency signal that has been produced through conversion into a video intermediate frequency VIF by a frequency conversion circuit, for example. The video intermediate frequency depends on the broadcast system. For example, it is 58.75 MHz in the NTSC scheme that is employed in Japan and other regions.

The video intermediate frequency signal $S_{IN}$ is amplified by the AGC amplifier 50, and an amplified signal $S_A$ is supplied to the phase comparator 10 and the AM detector 70. Since the gain of the AGC amplifier 50 is controlled in accordance with a control signal $S_C$ that is supplied from the AGC control circuit 60, the amplitude of the amplified signal $S_A$ is kept approximately constant irrespective of the magnitude of the input signal.

The phase comparator 10, the low-pass filter 20, and the VCO 30 constitute the PLL circuit. The phase comparator 10 compares the phase of the amplified signal $S_A$ with the phase of an output signal $S_L$ of the VCO 30 and produces a phase error signal S10 based on a phase error between those signals. The low-pass filter 20 attenuates high-frequency components of the phase error signal S10, extracts a low-frequency component in a prescribed frequency band, and supplies it to the VCO 30 as a frequency control signal. The VCO 30 controls the oscillation frequency in accordance with the frequency control signal supplied from the low-pass filter 20, and supplies an oscillation signal $S_L$ to the phase comparator 10 and the AM detector 70.

In this manner, the oscillation signal $S_L$ whose frequency varies following the frequency of the output signal $S_A$ of the AGC amplifier 50 can be generated by the PLL circuit that consists of the phase comparator 10, the low-pass filter 20, and the VCO 30. That is, the oscillation signal $S_L$ that is completely phase-synchronized with the input signal is generated inside the detection circuit. The AM detector 70 performs synchronous detection by using the sync signal $S_L$ by, for example, multiplying together the amplified signal $S_A$ of the AGC amplifier 50 and the oscillation signal $S_L$, and outputs a video detection signal $S_{PD}$ that varies in accordance with the amplitude of the signal $S_A$.

As shown in FIG. 11, the video detection signal $S_{PD}$ obtained by the AM detector 70 is supplied to the low-pass filter 110 and the comparator 80.

The comparator 80 compares the video detection signal $S_{PD}$ with a reference voltage V1 and supplies a comparison result to the AGC loop filter 90.

For example, the AGC loop filter 90 has a low-pass filter characteristic. The AGC loop filter 90 extracts a signal in a prescribed low-frequency band from the output signal of the comparator 80 and supplies the extracted signal to the AGC control circuit 60 and the PLL lock judgment circuit 120 as an AGC control signal $S_{AGC}$.

The AGC control circuit outputs, in accordance with the AGC control signal $S_{AGC}$, the control signal $S_c$ to be used for controlling the gain of the AGC amplifier 50. That is, in the detection circuit, a feedback loop is formed in which the gain of the AGC amplifier 50 is controlled in accordance with the video detection signal $S_{PD}$ that is output from the AM detector 70. Through the control of the feedback loop, the gain of the AGC amplifier 50 is controlled automatically so that the detection output level is kept approximately constant.

The PLL lock judgment circuit 120 outputs a PLL lock judgment signal $S_K$ indicating whether the PLL circuit consisting of the phase comparator 10, the low-pass filter 20, and the VCO 30 is in a lock state in accordance with the low-pass filter 110 and the AGC control signal $S_{AGC}$.

Incidentally, in the above conventional detection circuit, the PLL lock judgment is performed in accordance with the level of the video detection signal $S_{PD}$ and the state of the AGC control signal $S_{AGC}$. That is, whether the PLL circuit is in a lock state is judged based on the operation state of the entire detection system rather than the operation state of the PLL circuit itself. This results in a disadvantage that when an unexpected signal is input or in a transition state as occurs after the power is turned on, the operation of the detection circuit is prone to become unstable owing to an erroneous PLL lock judgment; there is fear of erroneous operation of a receiving circuit.

The present invention has been made in view of the above circumstances, and an object of the invention is therefore to provide a PLL detection circuit that can improve the stability of operation in a transition state, avoid occurrence of an erroneous operation, and perform PLL lock judgment correctly.

SUMMARY OF THE INVENTION

To attain the above objects, a PLL detection circuit according to the invention comprises a PLL circuit including a phase comparison circuit for comparing phases of an input signal and an oscillation signal and outputting a phase error signal corresponding to a phase error between the input signal and the oscillation signal based on a result of the comparison, and an oscillation circuit for generating the oscillation signal while controlling an oscillation frequency in accordance with the phase error signal; a PLL lock judgment circuit for judging whether the PLL circuit is in a lock state based on the phase error signal in such a manner as to judge that the PLL circuit is in a lock state if a voltage level of the phase error signal is in a prescribed range and to judge that the PLL circuit is out of a lock state if the voltage level of the phase error signal is out of the prescribed range; and a selection circuit for selecting a signal corresponding to the phase error signal, for example, an amplified signal produced by amplifying the phase error signal, or a voltage signal having a prescribed level in accordance with a judgment result of the PLL lock judgment circuit, and outputting the selected signal as an AFT control signal.

Another PLL detection circuit according to the invention comprises an AGC amplification circuit for amplifying an input signal at a prescribed gain; a PLL circuit including a phase comparison circuit for comparing phases of an output signal of the AGC amplification circuit and an oscillation signal and outputting a phase error signal corresponding to a phase error between the input signal and the oscillation signal based on a result of the comparison, and an oscillation circuit for generating the oscillation signal while controlling an oscillation frequency in accordance with the phase error signal; a PLL lock judgment circuit for judging whether the PLL circuit including the phase comparison circuit and the oscillation circuit is in a lock state based on the phase error signal in such a manner as to judge that the PLL circuit is in a lock state if a voltage level of the phase error signal is in a prescribed range and to judge that the PLL circuit is out of a lock state if the voltage level of the phase error signal is out of the prescribed range; a detection circuit for detecting the output signal of the AGC amplification circuit by using the oscillation signal as a reference signal, and outputting a detection signal; a first loop filter for extracting a prescribed frequency component from a signal that is based on the detection signal, for example, an output signal of a comparison circuit for comparing the detection signal with a prescribed reference signal; a selection circuit for selecting one of an output signal of the first loop filter and a second signal in accordance with a judgment result of the PLL lock judgment circuit, and outputting the selected signal; and an AGC control circuit for generating, in accordance with an output signal of the selection circuit, a gain control signal to be used for controlling a gain of the AGC amplification circuit, and supplying the gain control signal to the AGC amplification circuit.

In the invention, it is preferable that the PLL lock judgment circuit comprise a first comparison circuit for comparing the phase error signal with a first reference voltage; a second comparison circuit for comparing the phase error signal with a second reference voltage; and an output circuit for outputting a PLL lock judgment signal in accordance with comparison results of the first and second comparison circuits.

In the invention, it is preferable that the output circuit comprise a first diode having a cathode and an anode that are connected to an output terminal of the first comparison circuit and an output node, respectively; a second diode having a cathode and an anode that are connected to an output terminal of the second comparison circuit and the output node, respectively; and a resistance element provided between and connected to a supply line of a power source voltage and the output node, and that the PLL lock judgment signal at a high level corresponding to the power source voltage be output from the output node when output signals of both of the first and second comparison circuits are at a high level, and the PLL lock judgment signal at a low level be output from the output node when one of the output signals of the first and second comparison circuits is at a low level.

In the invention, it is preferable that the second signal be an output signal of a second loop filter for extracting a prescribed frequency component from the output signal of the comparison circuit.

Further, in the invention, it is preferable that the second signal be a voltage signal having a prescribed voltage.

According to the invention, in the one PLL detection circuit, whether the PLL circuit consisting of the phase comparison circuit, the low-pass filter, and the oscillation circuit is in a lock state is judged based on a phase error signal in the PLL circuit and a PLL lock judgment signal is output. One of a signal produced by amplifying the phase error signal or a prescribed constant voltage signal is selected in accordance with the state of the PLL circuit and output as an AFT control signal.

In the other PLL detection circuit according to the invention, an input signal is detected by using, as a reference signal, an oscillation signal generated by the PLL circuit and a prescribed frequency component is extracted by a loop filter from a signal corresponding to a result of comparison between a detection signal and a prescribed reference voltage. One of an output signal of the loop filter and a second signal, for example, an output signal of another loop filter or a constant voltage signal, is selected in accordance with the operation state of the PLL circuit, and an AGC control signal to be used for controlling the gain of the AGC amplification circuit is generated in accordance with the selected signal. As a result, the gain of the AGC amplification circuit is controlled so that a constant detection output is always obtained irrespective of the magnitude of the input signal.

DESCRIPTION OF THE PREFERRED EMBODIMENTS

First Embodiment

Figure 1:
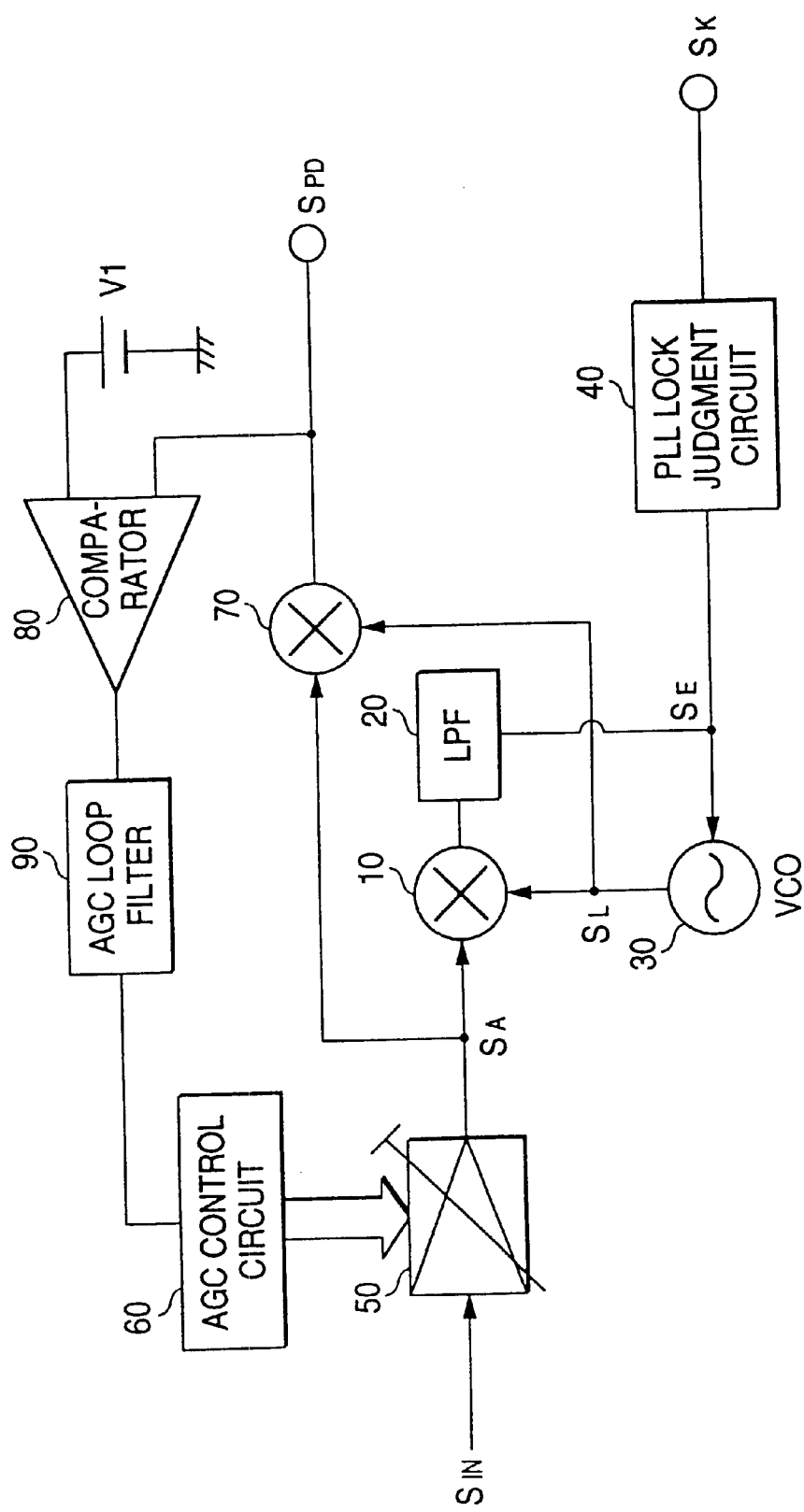
FIG. 1 is a circuit diagram of a PLL detection circuit according to a first embodiment of the present invention.

FIG. 1 is a circuit diagram of a PLL detection circuit according to a first embodiment of the invention. As shown in the figure, the PLL detection circuit of this embodiment is composed of a PLL circuit that consists of a phase comparator 10, a low-pass filter 20, and a VCO 30, a PLL lock judgment circuit 40, an AGC amplifier 50, an AGC control circuit 60, an AM detector 70, a comparator 80, and an AGC loop filter 90.

As shown in the figure, in the PLL detection circuit of this embodiment, the PLL lock judgment circuit 40 judges whether the PLL circuit is in a lock state by using a phase error signal $S_E$ in the PLL circuit.

An input signal $S_{IN}$ of the AGC amplifier 50 is an intermediate frequency signal that has been produced through conversion into a video intermediate frequency VIF by a frequency conversion circuit, for example. The AGC amplifier 50 amplifies the input signal $S_{IN}$ and outputs an amplified signal $S_A$. Since the gain of the AGC amplifier 50 is controlled in accordance with a control signal $S_C$, a constant video detection output is always obtained irrespective of the magnitude of a reception signal.

In the PLL circuit, the phase comparator 10 compares the phase of the amplified signal $S_A$ that is supplied from the AGC amplifier 50 with the phase of an oscillation signal $S_L$ of the VCO 30 and outputs a phase error signal corresponding to a phase error between those signals based on a comparison result.

The low-pass filter 20 eliminates high-frequency components of the output signal of the phase comparator 10, extracts a signal in a prescribed low-frequency band, and outputs it as a phase error signal $S_E$.

The VCO 30 controls the oscillation frequency in accordance with the phase error signal $S_E$ and outputs the oscillation signal $S_L$.

The above-described PLL circuit produces the oscillation signal $S_L$ that is phase-synchronized with the output signal $S_A$ of the AGC amplifier 50. The oscillation signal $S_L$ is supplied to the phase comparator 10 as a reference signal for phase comparison as well as to the AM detector 70 as a phase reference signal for detection.

The AM detector 70 performs synchronous detection by using, as a phase reference signal, the oscillation signal $S_L$ that is supplied from the VCO 30. The AM detector 70, which is a multiplier, for example, produces a video detection signal $S_{PD}$ corresponding to the envelope of the signal $S_A$ by multiplying together the amplified signal $S_A$ of the AGC amplifier 50 and the oscillation signal $S_L$.

The comparator 80 compares the video detection signal $S_{PD}$ with a prescribed reference voltage V1 and supplies a comparison result to the AGC loop filter 90.

The AGC loop filter 90, which is a low-pass filter, for example, extracts a prescribed low-frequency component from the output signal of the comparator 80 and supplies an extracted AGC control signal $S_{AGC}$ to the AGC control circuit 60.

The AGC control circuit 60 controls the gain of the AGC amplifier 50 in accordance with the AGC control signal $S_{AGC}$. Therefore, in the PLL detection circuit of this embodiment, the gain of the AGC amplifier 50 is controlled by the comparator 80, the AGC loop filter 90, and the AGC control circuit 60 in accordance with the video detection signal $S_{PD}$. Therefore, the gain of the AGC amplifier 50 is controlled automatically in accordance with a variation in the amplitude of the input signal $S_{IN}$ and the amplitude of the video detection signal $S_{PD}$ is kept approximately constant.

In the PLL detection circuit of this embodiment, the PLL lock judgment circuit 40 judges whether the PLL circuit is in a lock state based on the phase error signal $S_E$ in the PLL circuit. The configuration and the operation of the PLL lock judgment circuit 40 in the PLL detection circuit of this embodiment will be described below with reference to FIGS. 2 and 3.

Figure 2:
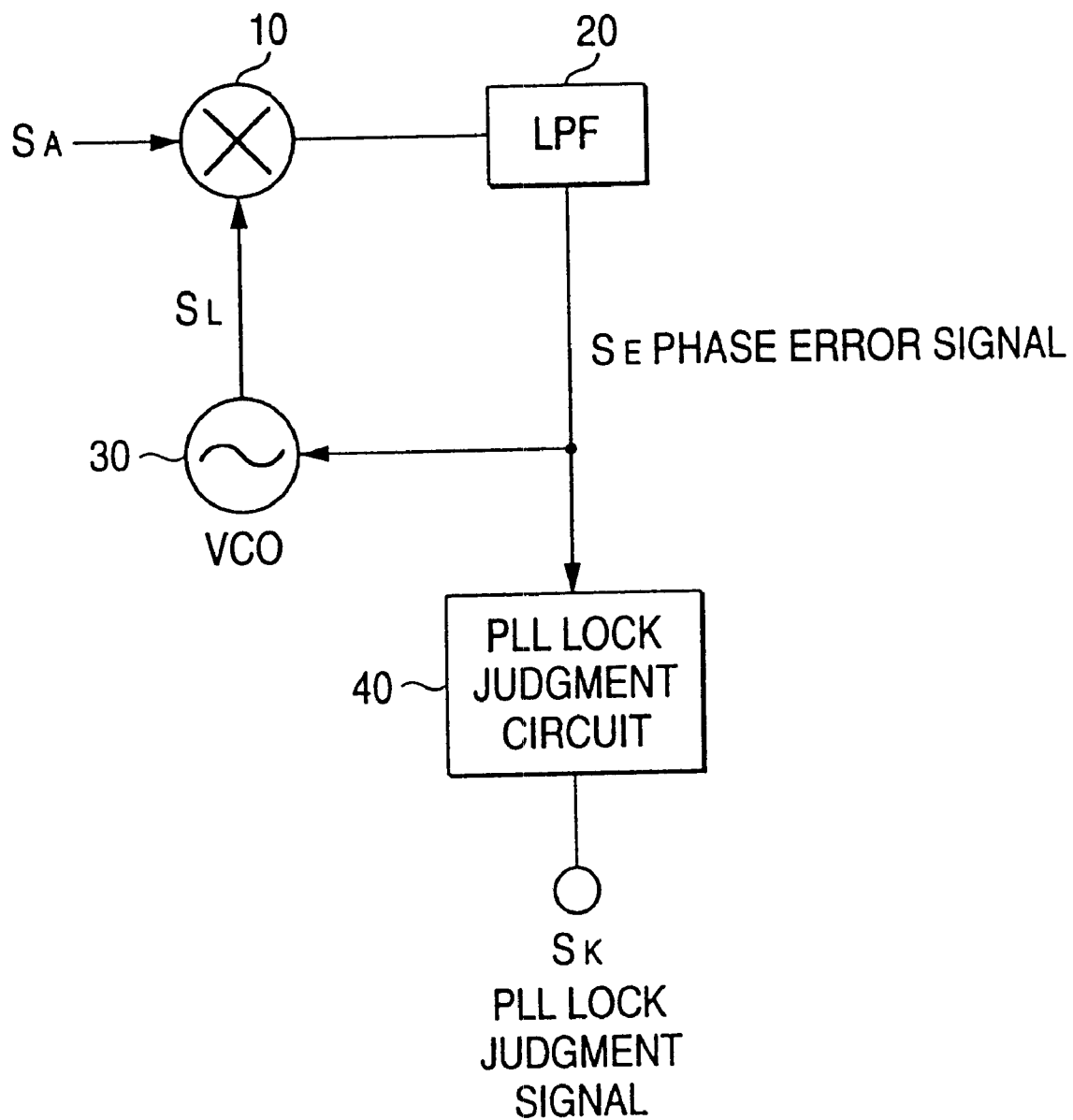
FIG. 2 is a circuit diagram of the main part of the PLL detection circuit.

FIG. 2 is a circuit diagram of a partial circuit of the PLL detection circuit according to the invention, and shows the main part that is composed of the PLL circuit that consists of the phase comparator 10, the low-pass filter 20, and the VCO 30, and the PLL lock judgment circuit 40.

As shown in the figure, the PLL circuit consists of the phase comparator 10, the low-pass filter 20, and the VCO 30. The phase comparator 10 and the low-pass filter 20 produce a phase error signal $S_E$ corresponding to a phase error between an input signal $S_A$ and an oscillation signal $S_L$ that is supplied from the VCO 30.

The oscillation frequency of the VCO 30 is controlled in accordance with the phase error signal $S_E$. The oscillation signal $S_L$ is supplied to the phase comparator 10 as a reference signal for phase comparison.

On the other hand, the PLL lock judgment circuit 40 judges whether the PLL circuit is in a lock state based on the phase error signal $S_E$, and outputs a PLL lock judgment signal $S_K$.

The PLL lock judgment circuit 40 of this embodiment judges whether the PLL circuit is in a lock state based on the level of the phase error signal $S_E$. In a state that the PLL circuit is locked, the oscillation frequency of the VCO 30 varies following the phase of the signal $S_A$ that is input to the phase comparator 10 of the PLL circuit. In this case, the phase error signal $S_E$ is linear with respect to the oscillation frequency of the VCO and the level of the phase error signal $S_E$ is in a prescribed range. Therefore, in the PLL detection circuit of this embodiment, whether the PLL circuit is locked is judged by comparing the level of the phase error signal $S_E$ with two threshold values.

Figure 3:
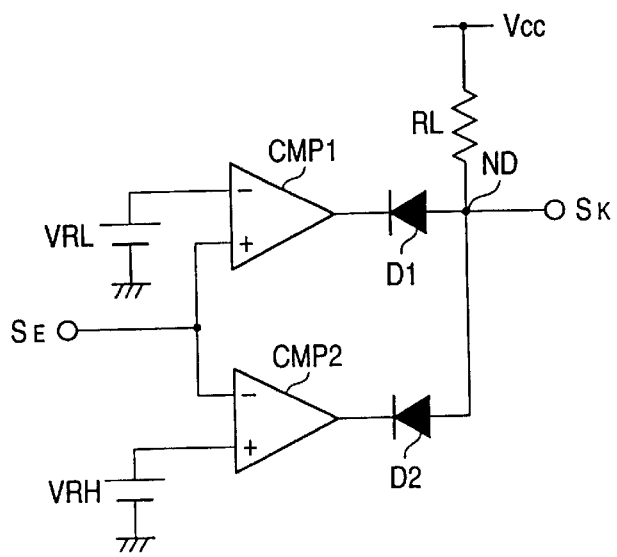
FIG. 3 is a circuit diagram showing the configuration of a PLL lock judgment circuit.

FIG. 3 shows an example configuration of the PLL lock judgment circuit 40. As shown in the figure, the PLL lock judgment circuit 40 is composed of comparators CMP1 and CMP2, diodes D1 and D2, and a resistance element RL.

A phase error signal $S_E$ is input to the positive input terminal (+) of the comparator CMP1 and a reference voltage VRL is input to its negative input terminal (−). Comparing the phase error signal $S_E$ with the reference voltage VRL, the comparator CMP1 outputs a high-level signal, for example, a signal of a power source voltage $V_{CC}$ level when the level of the phase error signal $S_E$ is higher than the reference voltage VRL. Conversely, when the level of the phase error signal $S_E$ is lower than the reference voltage VRL, the comparator CMP1 outputs a low-level signal, for example, a signal of the ground potential GND.

A reference voltage VRH is input to the positive input terminal (+) of the comparator CMP2 and the phase error signal $S_E$ is input to its negative input terminal (−). Comparing the phase error signal $S_E$ with the reference voltage VRH, the comparator CMP2 outputs a high-level signal when the level of the phase error signal $S_E$ is lower than the reference voltage VRH. Conversely, when the level of the phase error signal $S_E$ is higher than the reference voltage VRH, the comparator CMP2 outputs a low-level signal.

The output terminal of the comparator CMP1 is connected to the cathode of the diode D1 and the output terminal of the comparator CMP2 is connected to the cathode of the diode D2. The anodes of both diodes D1 and D2 are connected to an output node ND.

The resistance element RL is provided between and connected to a supply line of the power source voltage $V_{CC}$ and the output node ND.

As described above, in the PLL lock judgment circuit 40, the comparators CMP1 and CMP2 compare the phase error signal $S_E$ with the two reference voltages VRL and VRH, respectively. When the voltage of the phase error signal $S_E$ is higher than VRL and lower than VRH, the output signals of both comparators CMP1 and CMP2 are kept at a high level. In other cases, the output signal of the comparator CMP1 or CMP2 is kept at a low level.

The circuit constituted of the diodes D1 and D2 and the resistance element RL has approximately the same function as a logic circuit of an AND gate. That is, when the output signals of both comparators CMP1 and CMP2 are at a high level, both diodes D1 and D2 are off and a high-level signal $S_K$ is output from the output node ND. On the other hand, when the output signal of the comparator CMP1 or CMP2 is at a low level, the diode D1 or D2 is on. Therefore, a current flows through the resistance element RL and a low-level signal $S_K$ is output from the output node ND2.

FIG. 4 shows the operation of the PLL lock judgment circuit 40 of FIG. 3.

Figure 4A:
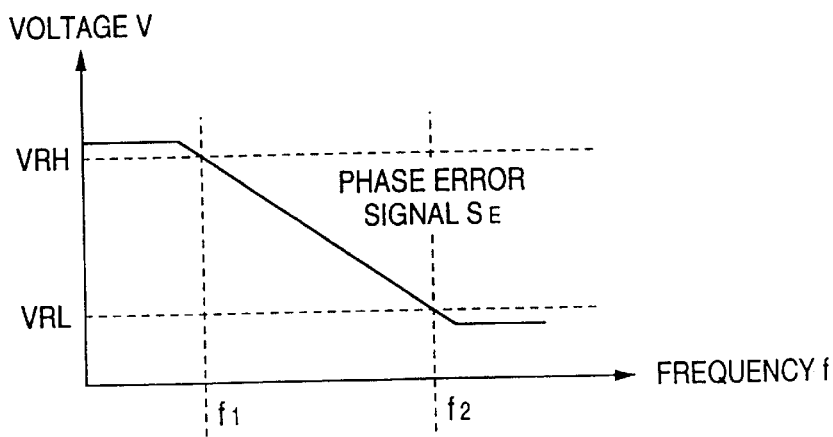
FIGS. 4A and 4B are diagrams showing signals that occur when the PLL lock judgment circuit is in operation.

As shown in FIG. 4A, the phase error signal $S_E$ varies in accordance with the oscillation frequency f of the oscillation signal $S_L$ of the VCO 30. The level of the phase error signal $S_E$ lowers as the oscillation frequency increases, and it increases as the oscillation frequency decreases. Even if the oscillation frequency decreases past a prescribed value or increases beyond another prescribed value, the phase error signal $S_E$ is kept at an approximately constant level.

Figure 4B:
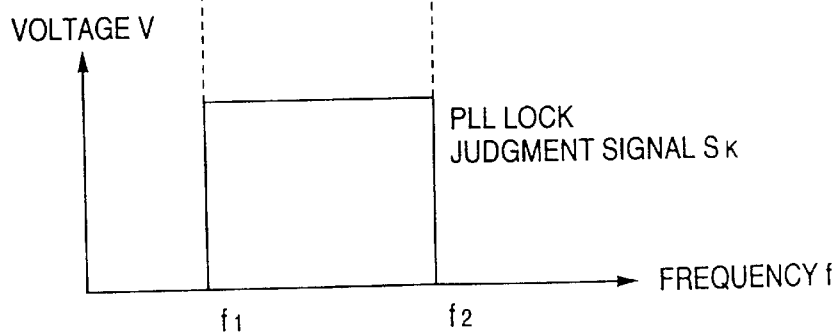

The phase error signal $S_E$ is compared with the reference voltages VRL and VRH shown in FIG. 4A by the comparators CMP1 and CMP2, respectively, and the AND of comparison signals of the respective comparators is output as the PLL lock judgment signal $S_K$. FIG. 4B shows the PLL lock judgment signal $S_K$. As shown in the figure, the PLL lock judgment signal $S_K$ is at a high level in a frequency range of $f_1$ to $f_2$ and it is at a low level in the other ranges, that is, when the frequency is lower than $f_1$ or higher than $f_2$.

As described above, according to this embodiment, in the PLL detection circuit, whether the PLL circuit is in a lock state is judged based on the phase error signal $S_E$ in the PLL circuit that is composed of the phase comparator 10, the low-pass filter 20, and the VCO 30. For example, the level of the phase error signal $S_E$ is compared with the two threshold values VRL and VRH, and the PLL circuit is judged in a lock state if the phase error signal $S_E$ is larger than VRL and smaller than VRH and it is judged out of a lock state in the other cases. The PLL detection circuit of this embodiment can output the PLL lock judgment signal $S_K$ correctly and stably because it judges whether the PLL circuit is in a lock state based on the phase error signal $S_E$ in the PLL circuit.

Second Embodiment

Figure 5:
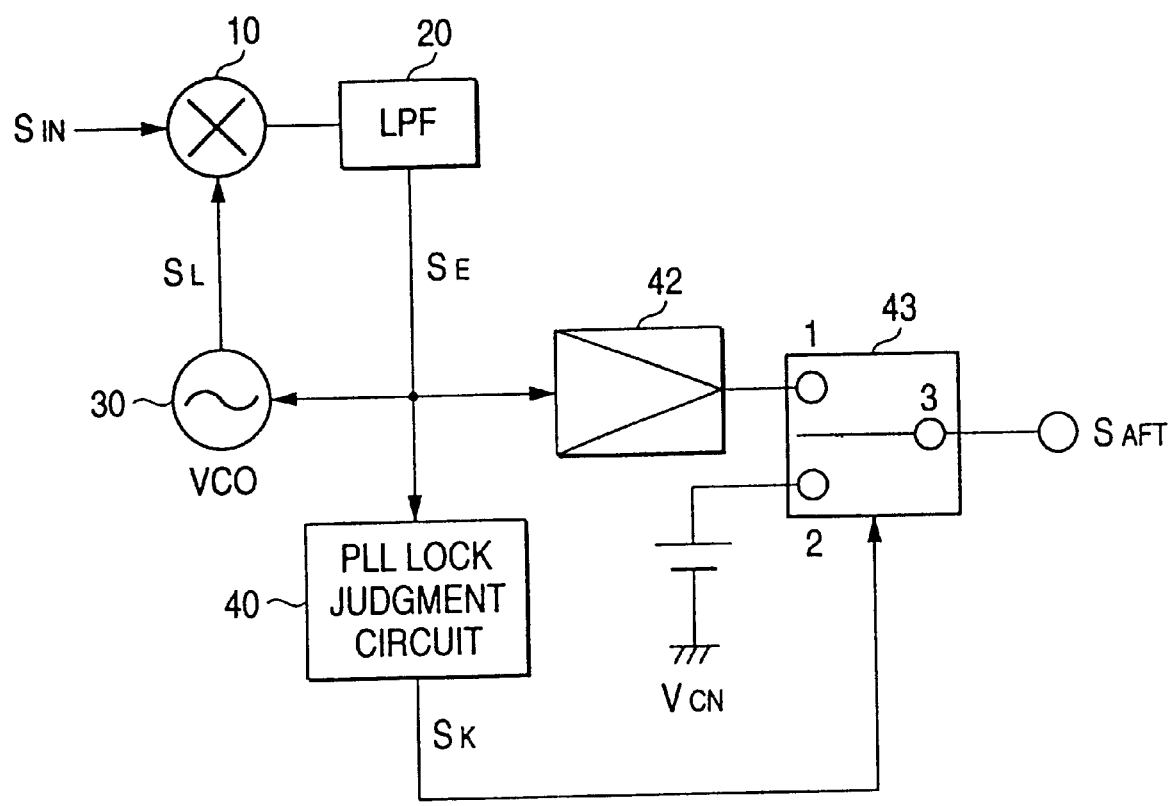
FIG. 5 is a circuit diagram of a PLL detection circuit according to a second embodiment of the invention, that is, a circuit diagram of an AFT control signal generation block.

FIG. 5 is a circuit diagram of a PLL detection circuit according to a second embodiment of the invention. As shown in the figure, this embodiment is directed to the configuration of a block that generates an AFT (automatic fine tuning) control signal $S_{AFT}$.

As shown in the figure, the block that generates an AFT control signal $S_{AFT}$ includes a PLL lock judgment circuit 40, an amplifier 42, and a switch 43 in addition to a PLL circuit that consists of a phase comparator 10, a low-pass filter 20, and a VCO 30.

The components of the PLL circuit and the PLL lock judgment circuit 40 are approximately the same in configuration as the corresponding components in the first embodiment shown in FIG. 2. That is, in the PLL circuit consisting of the phase comparator 10, the low-pass filter 20, and the VCO 30, the oscillation frequency of the VCO 30 is controlled in accordance with the phase of an input signal $S_{IN}$. As a result, an oscillation signal $S_L$ that is phase-synchronized with the input signal $S_{IN}$ is generated by the VCO 30.

The PLL lock judgment circuit 40 judges whether the PLL circuit is locked based on the level of the phase error signal $S_E$ in the PLL circuit. That is, when the level of the phase error signal $S_E$ is in a prescribed range the PLL lock judgment circuit 40 judges that the PLL circuit is in a lock state and outputs a high-level PLL lock judgment signal $S_K$. Conversely, when the level of the phase error signal $S_E$ is out of the prescribed range, the PLL lock judgment circuit 40 judges that the PLL circuit is out of a lock state and outputs a low-level PLL lock judgment signal $S_K$.

In the AFT control signal $S_{AFT}$ generation block of FIG. 5, the switch 43 is switched in accordance with the PLL lock judgment signal $S_K$ and outputs an AFT control signal $S_{AFT}$. When the PLL circuit is locked, that is, when the PLL lock judgment signal $S_K$ is at a high level, the switch 43 outputs a phase error signal $S_E$ as amplified by the amplifier 42. On the other hand, when the PLL circuit is not locked, that is, when the PLL lock judgment signal $S_K$ is at a low level, the switch 43 outputs a certain constant voltage $V_{CN}$.

FIG. 6 is diagrams showing signal levels that occur when the AFT control signal $S_{AFT}$ generation block of this embodiment is in operation.

Figure 6A:
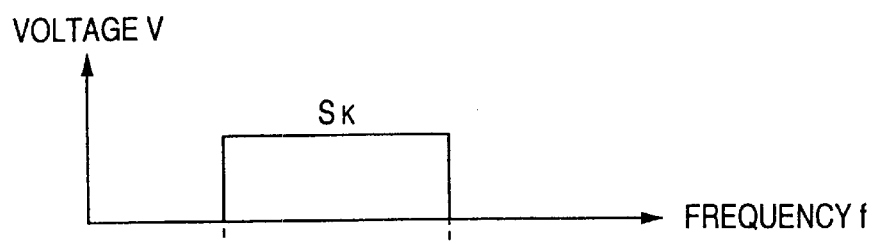
FIGS. 6A to 6C are diagrams showing signals that occur during operation in the second embodiment of the invention.
Figure 6B:
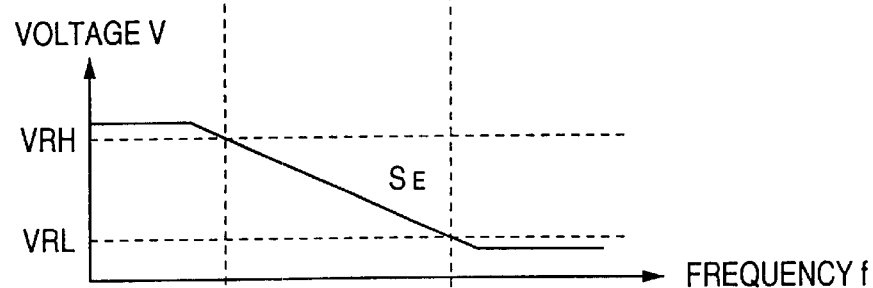

FIG. 6A shows the PLL lock judgment signal $S_K$ that is output from the PLL lock judgment circuit 40. FIG. 6B shows the phase error signal $S_K$ and the threshold voltages VRH and VRL in the PLL lock judgment circuit 40.

As shown in FIGS. 6A and 6B, the PLL lock judgment circuit 40 outputs a high-level PLL lock judgment signal $S_K$ when the level of the phase error signal $S_E$ is higher than the voltage VRL and lower than the voltage VRH. The PLL lock judgment circuit 40 outputs a low-level PLL lock judgment signal $S_K$ in the other cases.

Figure 6C:
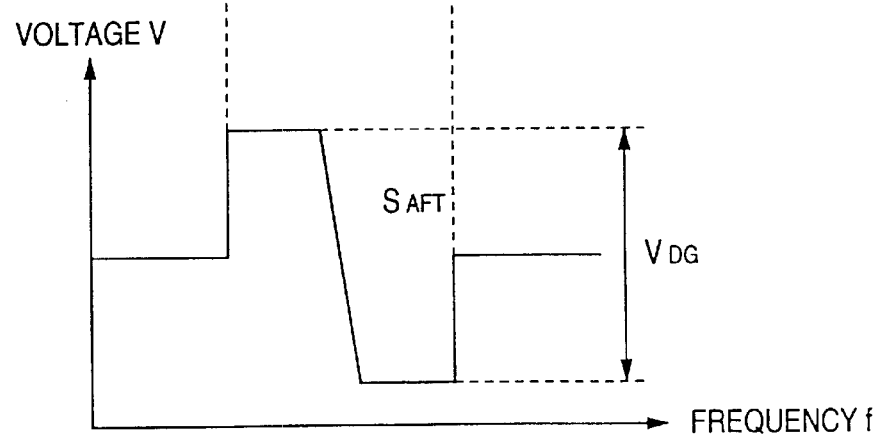

FIG. 6C shows the AFT control signal $S_{AFT}$. When the PLL circuit is in a lock state, that is, when the PLL lock judgment signal $S_K$ is at a high level, the switch 43 chooses the output signal of the amplifier 42 and outputs it as the AFT control signal $S_{AFT}$. As shown in FIG. 6C, if the dynamic range of the amplifier 42 is assumed to be $V_{DG}$, for example, when the level of the amplified signal goes out of the dynamic range, the amplifier 42 is saturated and its output signal is kept at a constant level.

When the PLL circuit is rendered out of a lock state, that is, when the PLL lock judgment signal $S_K$ is at a low level, the switch 43 chooses the constant voltage $V_{CN}$ and outputs it as the AFT control signal $S_{AFT}$. For example, the constant voltage $V_{CN}$ is set approximately at the center level of the dynamic range $V_{DG}$ of the amplifier 42.

Figure 7:
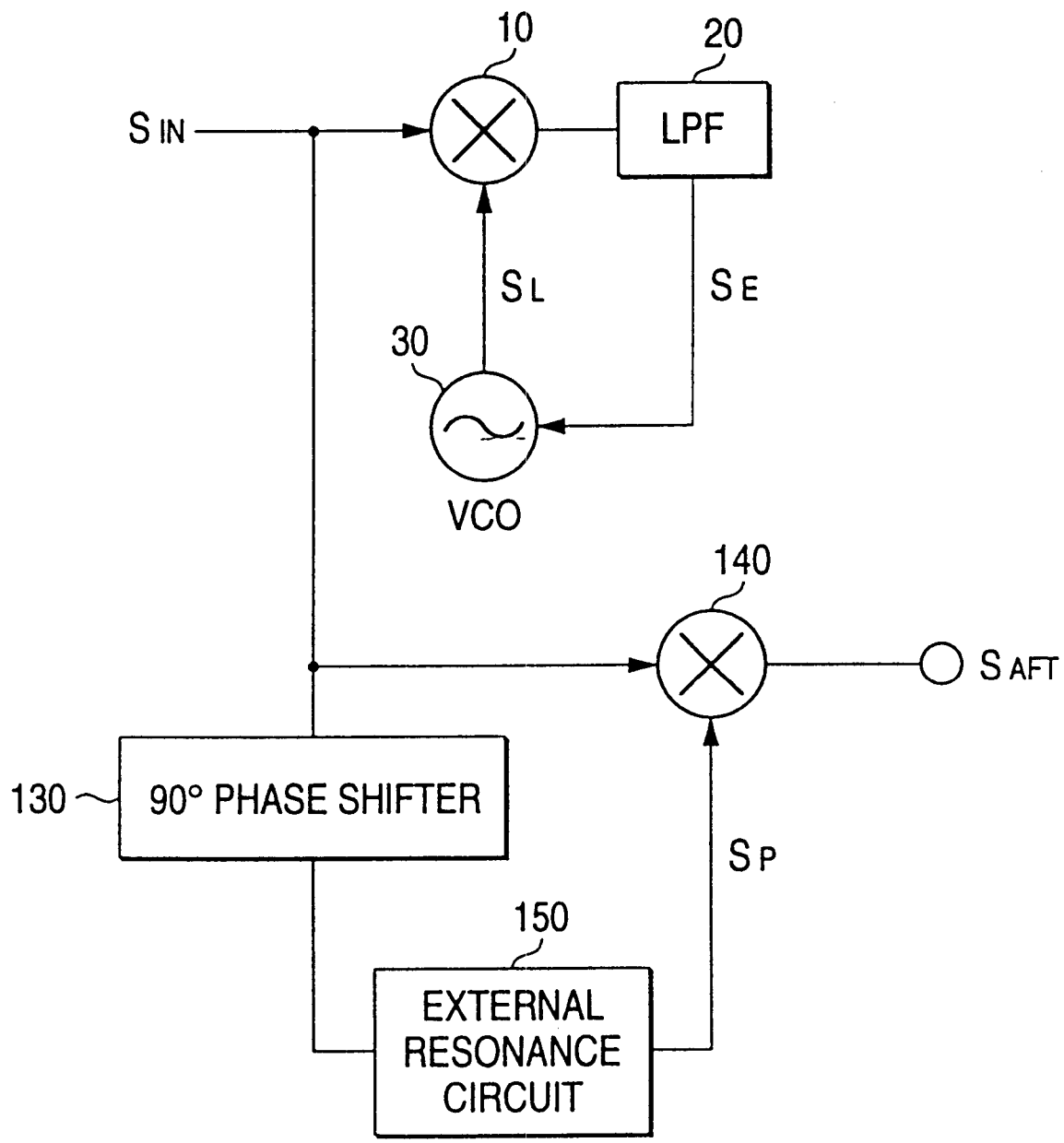
FIG. 7 is a circuit diagram of an example of a conventional AFT control signal generation circuit.

Now, for comparison, a conventional AFT control signal $S_{AFT}$ generation circuit is shown in FIG. 7. As shown in the figure, the conventional AFT control signal $S_{AFT}$ generation circuit is composed of a 90° phase shifter 130, a phase comparator 140, and an external resonance circuit 150 in addition to a PLL circuit that consists of a phase comparator 10, a low-pass filter 20, and a VCO 30.

Since as shown in the figure the PLL circuit controls the oscillation frequency of the VCO 30 so that it follows a phase variation of an input signal $S_{IN}$ that is a video intermediate frequency signal, for example, an oscillation signal $S_L$ that is phase-synchronized with an input signal $S_{IN}$ is generated.

The 90° phase shifter 130 supplies the external resonance circuit 150 with a signal produced by rotating the phase of the input signal $S_{IN}$ by approximately 90°.

The external resonance circuit 150, which is a resonance element such as a quartz resonance element having a stable oscillation frequency or an RC resonance circuit, shifts the phase in accordance with an output signal of the 90° phase shifter 130 and supplies a resulting signal $S_P$ to the phase comparator 140 as a reference signal for phase comparison.

The phase comparator 140 performs phase comparison on the input signal $S_{IN}$ by using, as a phase reference signal, the reference signal $S_P$ that is supplied from the external resonance circuit 150, and outputs a detection signal as an AFT control signal $S_{AFT}$. The phase comparator 140, which is a multiplication circuit, for example, multiples the input signal $S_{IN}$ by the reference signal $S_P$, and the level of the detection output signal varies in accordance with a variation in the frequency of the input signal $S_{IN}$. Therefore, if the phase comparison output signal is output as the AFT control signal $S_{AFT}$, the frequency control of a receiver can be performed in accordance with a variation in the frequency of the input signal $S_{IN}$.

However, the circuit scale of the conventional AFT control signal $S_{AFT}$ generation circuit is large because it is necessary to perform phase comparison with the phase comparator 140 as shown in FIG. 7. Further, the use of the external resonance circuit 150 increases the number of terminals in implementing the circuit as an IC, which is an obstacle to miniaturization of an IC chip and adversely affects the operational stability. In contrast, the AFT control signal $S_{AFT}$ generation block of this embodiment shown in FIG. 5 uses neither a phase comparator nor an external resonance circuit and hence can reduce the IC circuit scale and the circuit cost.

Figure 8:
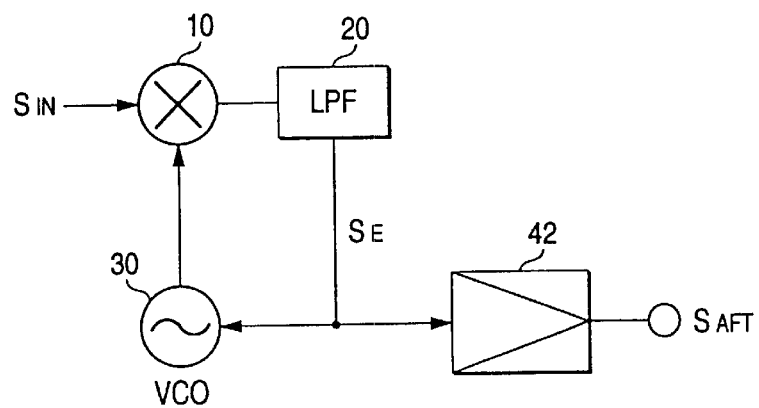
FIG. 8 is a circuit diagram of another example of a conventional AFT control signal generation circuit.
Figure 9A:
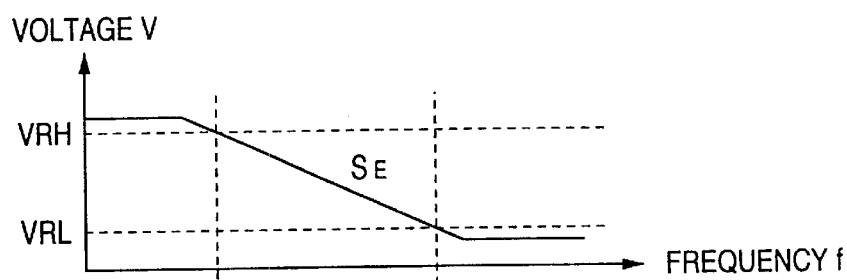
FIGS. 9A and 9B are diagrams showing signals that occur when the AFT control signal generation circuit of FIG. 8 is in operation.
Figure 9B:
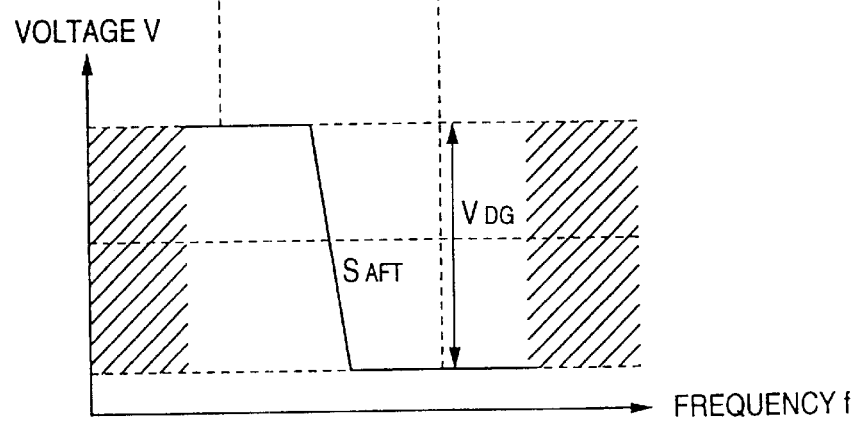

FIG. 8 shows another conventional AFT circuit that amplifies a phase error signal $S_E$ of a PLL circuit with an amplifier 42 and outputs an amplified signal as an AFT control signal $S_{AFT}$. FIG. 9 shows the AFT control signal $S_{AFT}$ in this case. FIG. 9A shows the phase error signal $S_E$. The AFT control signal $S_{AFT}$ shown in FIG. 9B is obtained by amplifying the phase error signal $S_E$ with the amplifier 42. A dynamic range $V_{DG}$ of the amplifier 42 is as shown in FIG. 9B. As shown in the figure, a signal obtained by amplifying the phase error signal $S_E$ is output as the AFT control signal $S_{AFT}$ in the dynamic range $V_{DG}$ of the amplifier 42. On the other hand, when the level of the amplified signal goes out of the dynamic range $V_{DG}$ of the amplifier 42, the amplifier 42 is saturated and the output signal is kept at a constant level.

The frequency control of a receiver can be performed in accordance with the AFT control signal $S_{AFT}$ shown in FIG. 9B. On the other hand, comparison between the AFT control signals $S_{AFT}$ shown in FIGS. 9B and 6C shows that the AFT control signal $S_{AFT}$ obtained by the signal generation block of this embodiment illustrated by FIG. 6C provides an S-shaped control characteristic that is closer to the ideal characteristic. A stable operation of a receiving circuit can be realized by performing the frequency control of a receiver by using the AFT control signals $S_{AFT}$ obtained by this embodiment.

Third Embodiment

Figure 10:
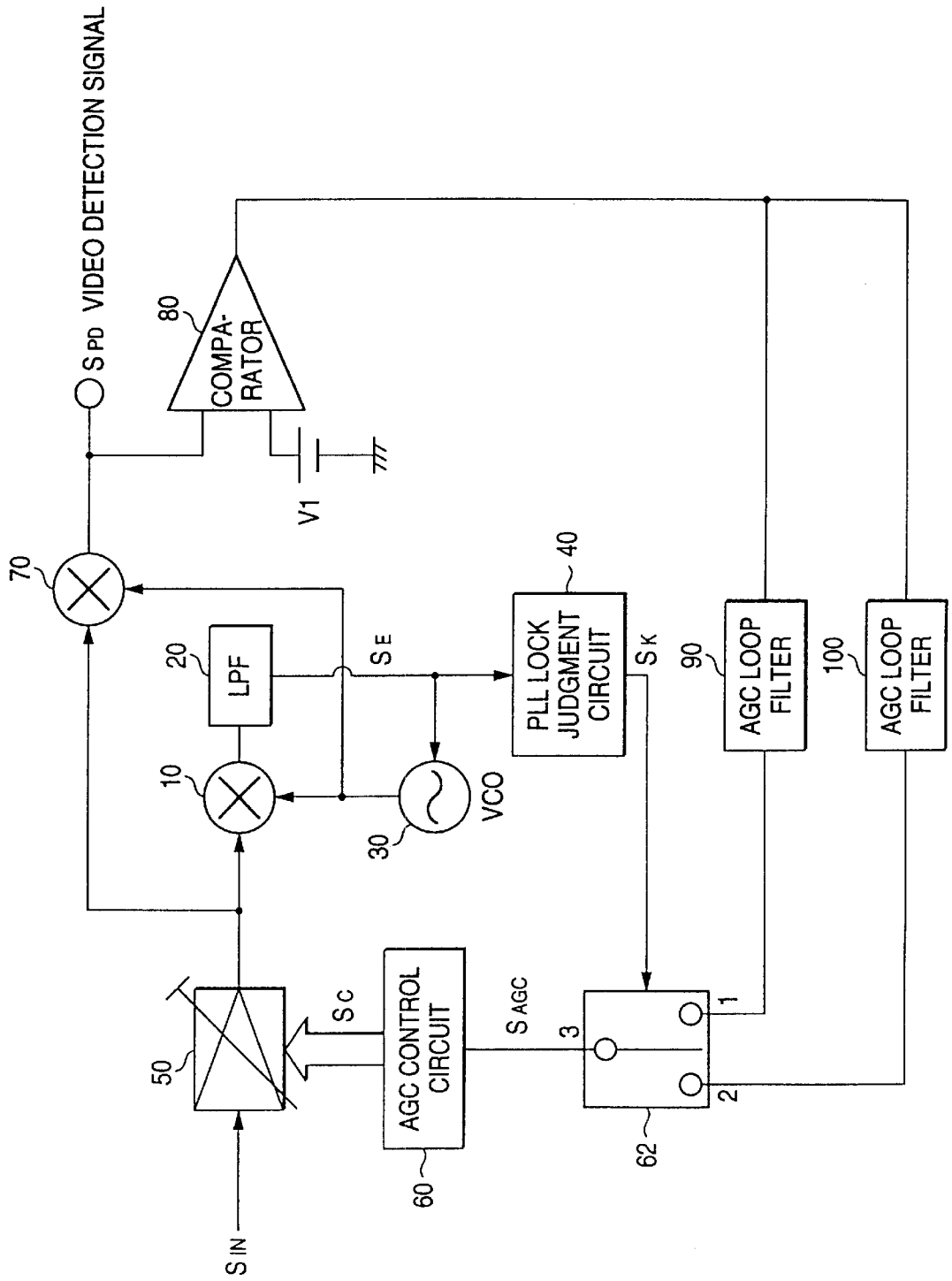
FIG. 10 is a circuit diagram of a PLL detection circuit according to a third embodiment of the invention.
Figure 11:
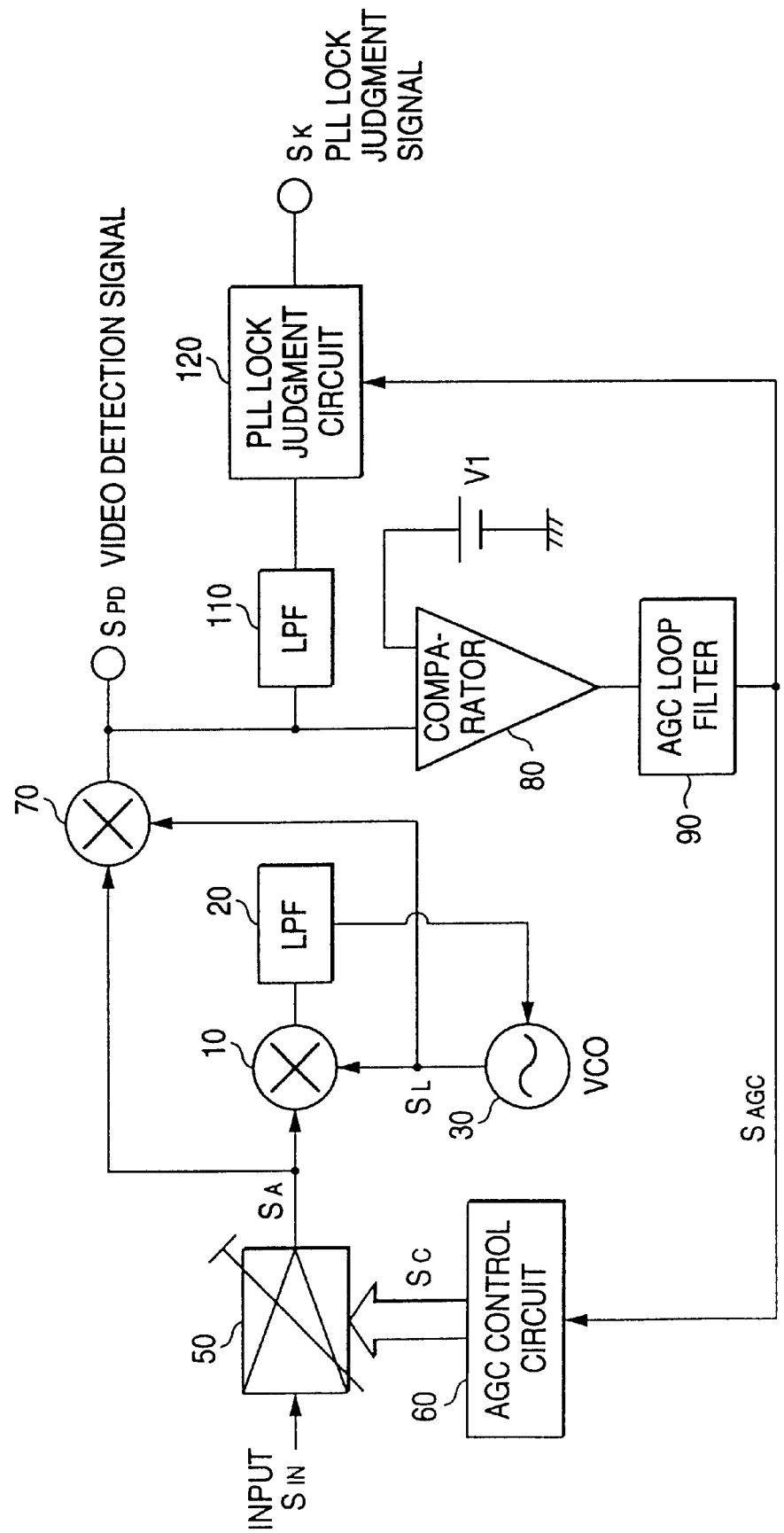
FIG. 11 is a circuit diagram of an example of a conventional PLL detection circuit.

FIG. 10 is a circuit diagram showing a PLL detection circuit according to a third embodiment of the invention. As shown in the figure, the PLL detection circuit of this embodiment is composed of a PLL circuit that consists of a phase comparator 10, a low-pass filter 20, and a VCO 30, a PLL lock judgment circuit 40, an AGC amplifier 50, an AGC control circuit 60, a switch 62, an AM detector 70, a comparator 80, and AGC loop filters 90 and 100.

In this embodiment, the PLL circuit consisting of the phase comparator 10, the low-pass filter 20, and the VCO 30 and the PLL lock judgment circuit 40 are approximately the same in configuration as the corresponding circuits in the first embodiment shown in FIG. 2. In the PLL circuit, the phase comparator 10 compares the phase of an amplified signal $S_A$ produced through amplification by the AGC amplifier and the phase of an oscillation signal of the VCO 30, and produces a signal corresponding to a phase error between those signals as a result of the comparison. The low-pass filter attenuates high-frequency components, extracts a signal in a prescribed low-frequency band, and outputs it as a phase error signal $S_E$. The oscillation frequency of the VCO 30 is controlled in accordance with the phase error signal $S_E$, and a resulting oscillation signal $S_L$ is supplied to the phase comparator 10 and the AM detector 70.

The PLL circuit generates the oscillation signal $S_L$ that is phase-synchronized with the input signal $S_A$. The oscillation signal $S_L$ is used as a reference signal for phase comparison for the phase comparator 10 and a detection reference signal for the AM detector 70.

The PLL lock judgment circuit 40 judges whether the PLL circuit is in a lock state based on the phase error signal $S_E$. For example, as in the case of the first embodiment, the PLL lock judgment circuit 40 judges whether the voltage of the phase error signal $S_E$ is in a prescribed range. The PLL lock judgment circuit 40 judges that the PLL circuit is locked if the voltage is in the prescribed range, and judges that the PLL circuit is out of a lock state if the voltage is out of the prescribed range. The level of a PLL lock judgment signal $S_K$ is set in accordance with the judgment result. For example, a high-level PLL lock judgment signal S, is output when the PLL circuit is in a lock state, and a low-level PLL lock judgment signal $S_K$ is output when the PLL circuit is not locked.

As shown in FIG. 10, in the PLL detection circuit of this embodiment, a parameter of the feedback loop for generating an AGC control signal $S_{AGC}$ is controlled in accordance with the PLL lock judgment signal $S_K$. For example, the switch 62 chooses one of output signals of the AGC loop filters 90 and 100 in accordance with the PLL lock judgment signal $S_K$ and supplies it to the AGC control circuit 60. The AGC control signal $S_{AGC}$ generation circuit will be described below in detail.

The AM detector 70 performs amplitude detection on an amplified signal $S_A$ that is supplied from the AGC amplifier 50 by using an oscillation signal $S_L$ as a reference signal and outputs a video detection signal $S_{PD}$. The video detection signal $S_{PD}$ is compared with a reference voltage V1 by the comparator 80, and a comparison signal corresponding to a comparison result is input to the AGC loop filters 90 and 100. Output signals of the AGC loop filters 90 and 100 are input to terminal-1 and terminal-2 of the switch 62, respectively.

The switch 62 chooses one of the input signals that are input to terminal-1 and terminal-2 in accordance with the PLL lock judgment signal $S_K$ and supplies it to the AGC control circuit 60. For example, when the PLL circuit is out of a lock state and the PLL lock judgment signal $S_K$ is at a low level, the switch 62 chooses the input signal that is input to terminal-1, that is, the output signal of the AGC loop filter 90, and supplies it to the AGC control circuit 60 as an AGC control signal $S_{AGC}$. Conversely, when the PLL circuit is in a lock state and the PLL lock judgment signal $S_K$ is at a high level, the switch 62 chooses the input signal that is input to terminal-2, that is, the output signal of the AGC loop filter 1001 and supplies it to the AGC control circuit 60 as the AGC control signal $S_{AGC}$.

The AGC control circuit 60 generates, in accordance with the AGC control signal $S_{AGC}$ that is input from the switch 62, a control signal $S_C$ to be used for controlling the gain of the AGC amplifier 50 and supplies it to the AGC amplifier 50.

As described above, in the PLL detection circuit of this embodiment, the two loop filters 90 and 100 are provided in the feedback loop for controlling the gain of the AGC amplifier 50 and switching is made between the outputs of the two loop filters in accordance with the operation state of the PLL circuit. For example, when the PLL circuit is locked, the output signal of the loop filter 100 having an ordinary time constant is chosen as the AGC control signal $S_{AGC}$ and supplied to the AGC control circuit 60. On the other hand, when the PLL circuit is not locked, the output signal of the loop filter 90 having a time constant representing a fast response is chosen as the AGC control signal $S_{AGC}$ and supplied to the AGC control circuit 60.

The AGC control of the PLL detection circuit of this embodiment is not limited to that in the above configuration. For example, it is possible to use a constant voltage source in place of the loop filter 90, in which case when the PLL circuit is not locked, the constant voltage of the constant voltage source is chosen by the switch 62 and supplied to the AGC control circuit 60 as the AGC control signal $S_{AGC}$. With this control, when the PLL circuit is made out of a lock state, an AGC control signal $S_{AGC}$ having the constant voltage is supplied to the AGC control circuit and the gain of the AGC amplifier 50 is controlled accordingly. Therefore, the stability of the detection operation is improved when the PLL circuit is not locked.

As described above, in this embodiment, the AGC control signal is generated by using one of the loop filters 90 and 100 having different time constants in accordance with the operation state of the PLL circuit, whereby a stable AGC control signal $S_{AGC}$ is generated when the PLL circuit is locked and the gain of the AGC amplifier 50 is controlled in accordance with such an AGC control signal $S_{AGC}$. When the PLL circuit is not locked, an AGC control signal $S_{AGC}$ having a fast response characteristic is generated and the gain of the AGC amplifier 50 is controlled quickly in accordance with such an input signal $S_A$. Therefore, stable AGC control can be realized.

As described above, in the PLL detection circuit according to the invention, the operation state of the PLL circuit is judged based on a phase error signal in the PLL circuit. Therefore, the operation state can be judge correctly and a stable operation can be realized.

In the PLL detection circuit according to the invention, an AFT control signal is generated by using the PLL lock judgment circuit. Therefore, an S-shaped control characteristic that is closer to the ideal characteristic can be realized. Further, since no external part is necessary, the chip area of an IC circuit and the power consumption can be made smaller than in the conventional AFT control signal generation circuit.

Since the response characteristic of the AGC control circuit is controlled in accordance with a PLL lock judgment result, the invention provides an additional advantage that a stable AGC control characteristic can be realized.

What is claimed is:

1. A PLL detection circuit comprising:

a PLL circuit including a phase comparison circuit for performing a comparison of phases of an input signal and an oscillation signal and outputting a phase error signal corresponding to a phase error between the input signal and the oscillation signal based on a result of the comparison and an oscillation circuit for generating the oscillation signal and for controlling an oscillation frequency of the oscillation signal in accordance with the phase error signal;

a PLL lock judgment circuit for judging whether the PLL circuit is in a lock state based on the phase error signal so as to judge that the PLL circuit is in a lock state when a voltage level of the phase error signal is in a prescribed range and to judge that the PLL circuit is out of a lock state when the voltage level of the phase error signal is out of the prescribed range; and a selection circuit for selecting a first signal corresponding to the phase error signal or a second signal having a prescribed voltage level in accordance with a judgment result of the PLL lock judgment circuit and outputting the selected signal as an automatic fine tuning control-signal.

2. The PLL detection circuit according to claim 1, further comprising an amplification circuit for amplifying the phase error signal and forming the first signal, wherein the selection circuit selects the first signal output from the amplification circuit or the second signal in accordance with the judgment result of the PLL lock judgment circuit.

3. The PLL circuit according to claim 1, wherein the PLL circuit further includes a filter for extracting a prescribed frequency component from the phase error signal and supplying the frequency component to the oscillation circuit.

4. The PLL detection circuit according to claim 1, wherein the PLL lock judgment circuit comprises:

a first comparison circuit for comparing the phase error signal with a first reference voltage;

a second comparison circuit for comparing the phase error signal with a second reference voltage; and an output circuit for outputting a PLL lock judgment signal in accordance with comparison results of the first and second comparison circuits.

5. The PLL detection circuit according to claim 4, wherein the output circuit comprises:

a first diode having a cathode and an anode connected to an output terminal of the first comparison circuit and an output node, respectively;

a second diode having a cathode and an anode connected to an output terminal of the second comparison circuit and the output node, respectively; and a resistance element connected between a supply line of a power source voltage and the output node, wherein the PLL lock judgment signal at a high level corresponding to the power source voltage is output from the output node when both output signals of the first and second comparison circuits are at a high level, and the PLL lock judgment signal at a low level is output from the output node when one of the output signals of the first and second comparison circuits is at a low level.

6. A PLL detection circuit comprising:

an AGC amplification circuit for amplifying an input signal at a prescribed gain;

a PLL circuit including a phase comparison circuit for comparing a phase of an output signal of the AGC amplification circuit and a phase of an oscillation signal generated by an oscillation circuit and outputting a phase error signal corresponding to a phase error between the input signal and the oscillation signal based on a result of the comparison of the phase comparison circuit, wherein the oscillation circuit generates the oscillation signal while controlling an oscillation frequency thereof in accordance with the phase error signal;

a PLL lock judgment circuit for judging whether the PLL circuit is in a lock state based on the phase error signal by judging that the PLL circuit is in a lock state when a voltage level of the phase error signal is in a prescribed range and judging that the PLL circuit is out of the lock state when the voltage level of the phase error signal is out of the prescribed range;

a detection circuit for detecting the output signal of the AGC amplification circuit by using the oscillation signal as a reference signal and outputting a detection signal;

a first loop filter for extracting a prescribed frequency component from a signal that is based on the detection signal;

a selection circuit for selecting one of a first signal output from the first loop filter and a second signal in accordance with a judgment result of the PLL lock judgment circuit and outputting the selected signal; and an AGC control circuit for generating, in accordance with the selected signal of the selection circuit, a gain control signal for controlling a gain of the AGC amplification circuit and supplying the gain control signal to the AGC amplification circuit.

7. The PLL detection circuit according to claim 6, further comprising a comparison circuit for comparing the detection signal with a prescribed reference signal, wherein the first loop filter extracts the prescribed frequency component from an output signal of the comparison circuit.

8. The PLL detection circuit according to claim 6, wherein the PLL circuit further includes a second loop filter for extracting a second prescribed frequency component from the phase error signal and supplying it to the oscillation circuit.

9. The PLL detection circuit according to claim 6, wherein the PLL lock judgment circuit comprises:

a first comparison circuit for comparing the phase error signal with a first reference voltage;

a second comparison circuit for comparing the phase error signal with a second reference voltage; and an output circuit for outputting a PLL lock judgment signal in accordance with comparison results of the first and second comparison circuits.

10. The PLL detection circuit according to claim 9, wherein the output circuit comprises:

a first diode having a cathode and an anode connected to an output terminal of the first comparison circuit and an output node, respectively;

a second diode having a cathode and an anode connected to an output terminal of the second comparison circuit and the output node, respectively; and a resistance element connected between a supply line of a power source voltage and the output node, wherein the PLL lock judgment signal at a high level corresponding to the power source voltage is output from the output node when both output signals of the first and second comparison circuits are at a high level, and the PLL lock judgment signal at a low level is output from the output node when one of the output signals of the first and second comparison circuits is at a low level.

11. The PLL detection circuit according to claim 6, wherein the second signal is an output signal of a second loop filter for extracting a second prescribed frequency component from the output signal of the comparison circuit.

12. The PLL detection circuit according to claim 6, wherein the second signal is a voltage signal having a prescribed voltage.

* * * * *